Nov. 2, 1965 LE ROY A. PHOHOFSKY 3,214,827

ELECTRICAL CIRCUITRY FABRICATION

Filed Dec. 10, 1962 2 Sheets-Sheet 1

INVENTOR
LEROY A. PROHOFSKY
BY Herbert F. Sauerwein [signature]
ATTORNEY

Nov. 2, 1965 LE ROY A. PHOHOFSKY 3,214,827

ELECTRICAL CIRCUITRY FABRICATION

Filed Dec. 10, 1962 2 Sheets-Sheet 2

INVENTOR
LEROY A. PROHOFSKY
BY Herbert [signature]
ATTORNEY

United States Patent Office 3,214,827

Patented Nov. 2, 1965

3,214,827

ELECTRICAL CIRCUITRY FABRICATION

Le Roy A. Prohofsky, Minneapolis, Minn., assignor to Sperry Rand Corporation, New York, N.Y., a corporation of Delaware Filed Dec. 10, 1962, Ser. No. 243,533

12 Claims. (Cl. 29—155.5)

This invention relates generally to the electrical interconnection of printed circuit cards and more specifically to a soldering method for interconnecting a plurality of superimposed printed circuit cards.

Printed circuit cards, commonly termed simply "printed circuits" are well known and extensively used in the electronics industry. Recent trends in the industry toward miniaturization of electronic devices have resulted in a variety of printed circuit packaging schemes for arranging a compact circuit assembly. For reducing circuit card space requirements, special packaging techniques have been developed which permit integration of several circuit cards into a single unit or assembly. In one such technique the printed circuit cards are disposed in stacked or superimposed relation. Electrical interconnections of circuitry disposed on different card levels within the stack are then made by a plurality of individual interconnecting means which are located substantially internal to the stack itself.

Fabrication of a multilayer circuit assembly utilizing the aforementioned type of interconnecting means is accomplished by stacking in registered relation a plurality of circuit cards having a predetermined pattern of plated-through holes or apertures. The circuitry portion of each card may consist of conductive strips disposed on a major planar surface of the card and electrically connected to selected conductive aperture linings. Since the cards are in registration with one another, corresponding plated-through holes in adjacent circuit cards are aligned and effectively form a conductive socket. An interconnecting means, usually in the form of an electrically conductive resilient tubular member, is then inserted into each series of aligned holes. Being resilient, the member expands radially and thereby frictionally engages the conductive aperature linings making electrical contact therewith. Card circuitry on different levels is electrically connected by means of the interconnecting member.

Several shortcomings are inherent in the use of the interconnecting means described above. For example, when using such an interconnecting means with a circuit assembly wherein the circuit cards are stacked in very close relation, aperture diameters are critical. If the diameter of one aperture in an aligned series of apertures is somewhat smaller than the next, the resilient interconnecting member is prevented from expanding a sufficient amount to make reliable electrical contact with the conductive linings on all of the apertures. A further objection to reliance on an electrical contact formed as above described, involves the tendency of resilient materials to take a permanent set and thereby effectively lose their biasing force. Where an electrical contact was not initially a good contact, loss of resiliency in the interconnecting means may cause electrical failures.

In order to overcome the above-mentioned objections, many attempts have been made to solder the interconnecting means to the aperture linings. In one method the interconnecting means and the aperture linings are coated with a thin layer of solder alloy and, after assembly, the unit is heated to cause the formation of solder connections. This method of forming electrical connections in a stack of closely spaced superimposed printed circuit cards have been found unsatisfactory in certain aspects. For example, the forming of an oxide film on the solder coated aperture linings and interconnecting means interferes with the formation of reliable solder connections. When penetration of the oxide film does not occur, it may be necessary to use a flux to prepare the surfaces for soldering, and gases generated by the flux breakdown may cause the formation of voids in the solder joints. Additionally, there exists the problem of formation of a uniform and sufficient thickness of solder on the members such that an adequate amount of solder is present at the point where is it desired to form a solder interconnection. Another difficulty in the formation of solder connections as above described involves the problem of uniformly heating the assembly to a desired temperature without excessively heating any particular portion or forming additional oxides along areas where oxides are undesirable.

A further problem involving soldered circuit assemblies pertains to the disassembly of the circuit to permit corrections or adjustments to be made. Methods presently used to interconnect a plurality of printed circuits by soldering do not produce a circuit assembly which can be easily and readily disassembled.

Accordingly, it is the primary object of the present invention to provide an improved soldering method for electrically interconnecting a plurality of closely spaced superimposed printed circuit cards.

It is also an object of the present invention to provide a soldering method for electrically interconnecting stacked printed circuit cards wherein all the solder connections are made simultaneously without excessively heating any portion of the stack.

It is a further object of the present invention to provide a soldering method for electrically interconnecting stacked printed circuit cards which method permits the stack to be disassembled without damage to any of the stack members.

It is yet another object of the present invention to provide a soldering method for interconnecting a plurality of stacked printed circuit cards wherein the soldering is accomplished at a uniform and controlled temperature in a non-oxidizing atmosphere.

It is a still further object of the present invention to provide a method for electrically interconnecting a plurality of stacked printed circuits by a solder operation wherein sufficient amounts of solder are provided at the points where solder interconnections are to be made.

It is a still further object of the present invention to provide a soldering operation wherein the interconnecting member is guided within an aligned series of apertures by the geometry of the apertures through which the member passes.

The above objects are accomplished in accordance with the method of the present invention which includes the steps of forming a plurality of printed circuit cards each having a predetermined pattern of plated-through holes formed therethrough and conductors disposed thereon, filling each aperture with a solder alloy, superimposing the circuit cards with the apertures of each card in registration with those of any other card, locating a solder coated projection adjacent to and in alignment with a series of aligned apertures, immersing the stacked circuit cards and projections in an oil bath maintained at a temperature adequate to cause the solder to melt and upon the melting of the solder, causing the projections to be disposed in each series of aligned apertures and thereafter permitting the assembly to cool whereupon the interconnecting means is electrically connected by solder to the conductive linings on the aperture walls.

The novel features of the invention, as well as additional objects and advantages thereof, will be understood more fully from the following description when read in connection with the accompanying drawings, in which.

Figure 1:
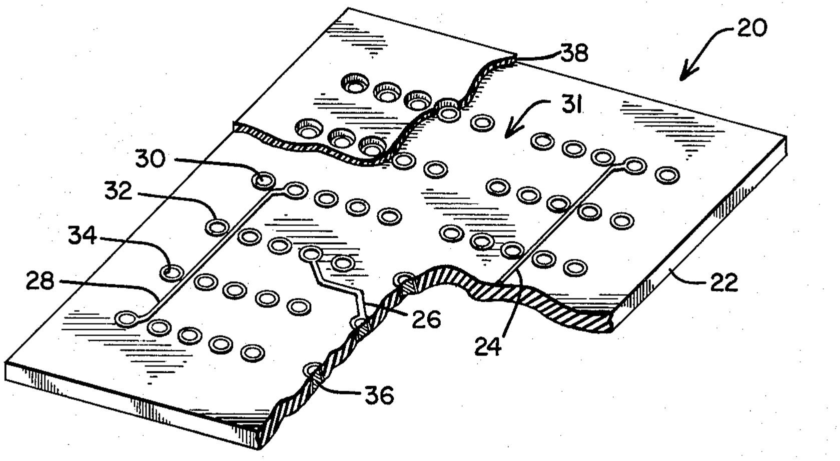
FIG. 1 is a perspective view of a multiapertured, single-layered printed circuit card of the type used in the present embodiment, a small portion of the card being shown in cross-section.

Referring now to FIG. 1, there is seen a multiapertured printed circuit card 20 of the type employed in the preferred embodiment of the present invention. The card includes an electrically insulating support member 22 formed from an epoxy resin which may be reinforced as desired, for example, with a filler such as mineral-glass. Other materials, for example, ceramic materials may also be used to fabricate the support member. However, the material selected for forming the base member should be capable of withstanding the elevated temperatures at which soldering is permitted to occur for a period of approximately one to two hours without being substantially distorted or losing its dielectric characteristic. The support 22 should have a thickness that allows it to be handled with a relative degree of ease and in the preferred embodiment the member has a thickness of about 0.015 inch. The member 22 has a plurality of conductors 24, 26, and 28 formed on one major surface thereof and a plurality of apertures 30 formed therethrough. The conductors are formed of good electrically conducting material, such as copper, which may be protected from corrosion by a thin layer of another metal, such as gold. A plurality of small annular metallic rings 32 are also disposed on the surface of the member 22. Each ring 32 surrounds an aperture 30 and is preferably integral with an electrically conductive lining 34 disposed on the wall of each aperture. In the preferred embodiment the linings 34 are copper, but may be any good conducting solderable material. The linings may be formed in the individual apertures 30 by conventional plated-through hole techniques and the rings 32 and conductors are formed at the same time. The rings 32 are not necessary but are believed desirable for strengthening the bond between the lining 34 and the support member. The apertures 30 are formed in the base member in accordance with a predetermined pattern, and in the preferred embodiment the apertures gradually diminish in width, being formed in the shape of a truncated cone. The reason for shaping the apertures in this manner will be discussed hereinbelow. Because of the tapered aperture geometry, conductors are preferably formed on only one side of the support member. The larger diametered end of the aperture limits the amount of surface area available to support conductors on one side of the support member and because of the limited area available, conductor fabrication on both major surfaces of the support member becomes exceedingly difficult. However, if the support members are formed with cylindrically shaped apertures, conductors may be disposed on opposite sides of the support member without difficulty, and the aperture lining may be formed from a sleeve member which may be frictionally secured within the aperture. It should be noted that the smaller diametered end of each tapered aperture opens on the circuit bearing surface of the support 22 and that the apertures are arranged such that they appear to be separated into two groups with a small space 31 therebetween. Disposed within each aperture 30 is a slug or fillet of solder 36. The fillet 36 is preferably formed from an alloy consisting of 60% tin and the remainder lead.

Covering the circuit bearing surface of the member 22 and the conductors thereon, is a solder resist layer 38. Preferably the layer 38 is formed from a photo sensitive solder resist material such as Empire Special Top Enamel, a product of Empire Laboratories, Inc., New York, New York. The layer 38 is selectively disposed on the card 20 such that no portion thereof enters the apertures 30. It is preferred that the annular rings 32 also remain free from the coating 38, however, if a small amount of the resist should be inadvertently disposed on the rings 32, it can be accommodated by the method of this invention.

Figure 2:
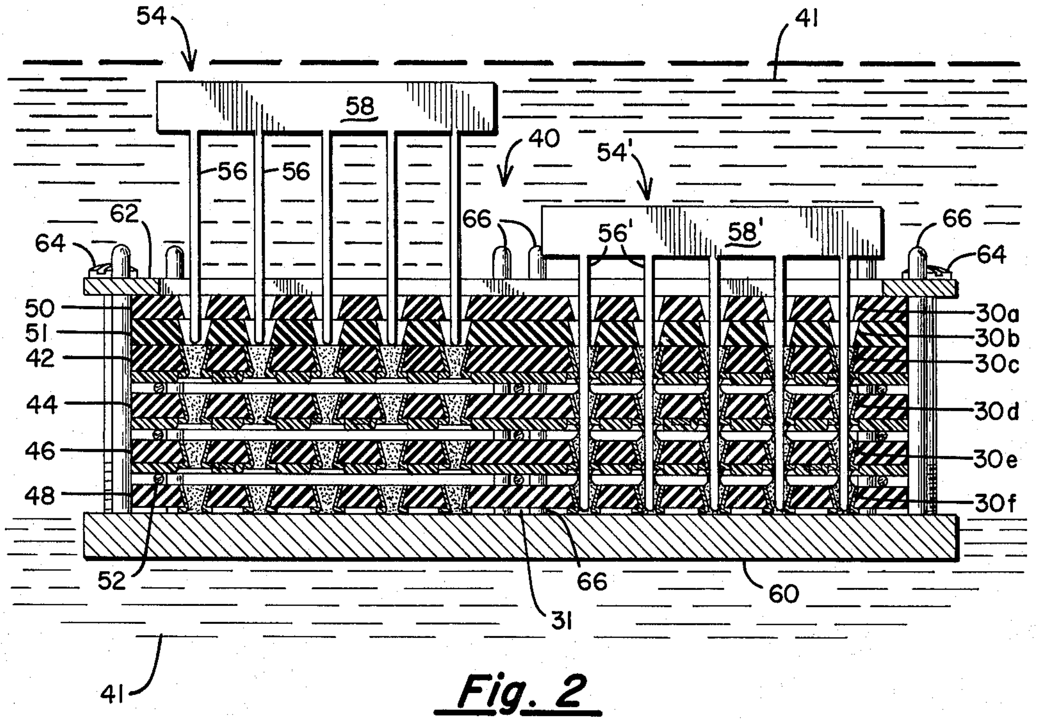
FIG. 2 is a cross-sectional side view of an exemplary stack of printed circuit cards and associated apparatus arranged in accordance with the method of this invention, the stack and apparatus being shown disposed in an oil bath.

Referring now to FIG. 2, there is seen an assembly, generally designated by the numeral 40, immersed in an oil 41 contained in a tank (not shown) which may be heated, for example, on a hot plate (not shown). It is the purpose of the oil 41 to provide a non-oxidizing atmosphere wherein selected solder alloys may be heated to their melting point. The oil 41 is preferably a corn oil, however, any oil which does not break down or become reactive at the soldering temperatures may be employed in lieu thereof. The assembly 40 includes a plurality of superimposed apertured planar members among which are the printed circuit cards 42, 44 and 46, a cover card 48, and an alignment means in the form of a pair of guide cards 50 and 51. These members are secured in fixed relation by a holding fixture which includes a base member 60, a cover member 62, and a clamping means in the form of a plurality of corner-located screws 64 which exert a slight compression force on the stacked members. A plurality of guide pins 66 which are affixed to the base member 60 are used to register the apertured members during stacking, the edges of the apertured members serving as reference points. The circuit cards 42, 44 and 46 are substantially identical to circuit card 20 (see FIG. 1) with the exception that the different cards exhibit different conductor patterns. Three circuit cards have been chosen for exemplifying the embodiment discussed herein, although as many as twelve circuit cards have been soldered simultaneously by the method taught by this application. The cover card 48, which is disposed adjacent the lowermost circuit card 46 for protecting that card and its associated circuitry, has no electrical conductors thereon but otherwise corresponds to the circuit cards. If desired, the cover card may be formed without any metallic portions, that is without aperture linings or solder slugs. However, it has been found that a cover card having solder fillets disposed in its apertures, facilitates electrical testing of the completed circuit stack, the solder fillets serving conveniently, after assembly, as contact points for the testing probes. Further, when a cover card is used according to the method of the present invention, it provides a degree of protection not provided by other assembly techniques, this additional protection enhancing the reliability of the ultimate assembly and also reducing the cost. As will be understood by one skilled in the art, a protective cover card is not an absolute necessity and that when employed, it may take a form other than described above. For example, a thin layer of an insulating material may be disposed on the unprotected circuit card after electrical testing and the use of a special cover card be thereby completely obviated. If the last described protection techniques were used, it can be seen that the conductors on the exposed circuit card would be subject to damage from the time the circuit cards were interconnected until the protective insulating film was laid down. Thus, damage may occur during the interim operations, for example, as a result of handling during electrical testing and take the form of mars or scratches on the conductors which may result in conductor interrupts or local overheating necessitating reworking the circuit stack. The method of the present invention obviates this danger by providing the circuit card with protection from the time the stack interconnections are made by arranging the cover card 48 as a portion of the stack.

Located adjacent the uppermost circuit card 42 are a pair of guide cards 50 and 51 which are used to facilitate the alignment and insertion of the interconnecting means of this invention as will be seen more clearly hereinafter. The guide cards 50 and 51 are similar to the circuit cards but do not have any metallic members thereon. Since the aperture patterns of the circuit cards 42, 44 and 46, the cover card 48, and the guide cards 50 and 51 are substantially identical, these planar members may be superimposed with the apertures of each member in registration with corresponding apertures of any other members, thus, an aligned series of apertures 30*a*, 30*b*, 30*c*, 30*d*, 30*e*, and 30*f*, is formed by appropriately locating the various members. As can be seen, the members are disposed with their circuit bearing surface downward and with the smaller diametered end of the apertures of one member opening into the larger diametered end of the apertures of the next adjacent member.

Disposed between adjacent circuit cards and between the cover card and the lowermost circuit card are a plurality of spacer members 52. In the preferred embodiment the spacer members are formed from glass rods and have a diameter of about 0.010 inch. The spacers 52 are located in the space 31 between aperture groups and at the perimeter of the cards and function to maintain the circuit cards in spaced relation. As will be seen more clearly hereinafter, the clearance between circuit cards facilitates a cleaning operation that occurs after soldering and provides an area into which displaced solder may flow without interfering with the operation of the circuit stack. The provision of a separation between adjacent circuit cards also permits the oil 41 to flow freely between the cards thus exposing the assembly to a controlled and uniform degree of heat throughout assuring that all solder areas will be properly heated to the desired temperature. A cylindrical geometry was assigned to the spacer members 52 because that particular geometry minimizes the trapping of oil in the stack and thus facilitates cleaning. Alternative materials that may be used to form the spacers would include high temperature epoxy resins or ceramics.

A pair of similarly constructed comb-like riser members 54 and 54′ are also seen immersed in the oil 41. The riser members 54 and 54′ include a plurality of projections or interconnecting members 56 and 56′ respectively mechanically interconnected by the bridge portions 58 and 58′. In the present embodiment, the riser members have been formed from a beryllium-copper alloy which has been appropriately tempered to a predetermined degree of strength. The forming of the risers may be accomplished by conventional die stamping, but it is believed that they are most economically formed by etching, which etching may be accomplished using well known photo-etching processes such as are employed in the fabrication of printed circuit cards. Although beryllium-copper has been found, in the light of the many design factors considered, to be a particularly suitable alloy for fabricating the herein discussed preferred embodiment, other alloys such as Phosphor bronze may also be used. After the riser combs have been formed they are coated with a solder alloy, the solder coating being accomplished by dipping in molten solder or by electroplating. Immediately after solder coating and until such time as the risers are disposed in positions comparable to that of riser 54, they are immersed in an oil to prevent the oxidation of the solder coating. It should be understood that it is not necessary to solder coat the riser members. If desired, the risers may be cleaned after forming and then retained in a non-oxidizing atmosphere until use, or simply cleaned immediately before use. However, if the risers are solder coated prior to being disposed in the circuit assembly, any areas that do not wet with solder are discovered at that time and may then be corrected, thus avoiding the discovery of defective solder joints after the interconnections have been made. The thickness of the solder coating on the projections of the riser member is not critical, in that when a projection is urged into an aperture series, the solder is in a liquid state. The riser member 54 is positioned in FIGURE 2 to illustrate the location of the riser members prior to the time the solder fillets have been heated by the heated oil 41. It can be seen that the end portion of each projection 56 is located in the uppermost portion of an aligned aperture series, and more specifically in that portion of the series formed by the apertures of the guide cards.

The small diameter of the guide card apertures and the thickness of the guide cards cooperate to secure the riser members in a desired position, that is, with each projection 56 having its longitudinal axis substantially coaxial with an aligned aperture series. The riser member 54′ is disposed to illustrate the position of the member after the solder fillets have melted and a slight force has been exerted on the riser member to urge the individual projections into their respective aperture series. The member 54′ has been urged into the stack until the ends of the projections 56′ strike the base member 60. That portion of each projection which protrudes from the bottom of the stack, along with the annular rings 32 on the cover card and displaced solder adjacent the base member 60 are removed by grinding after the base member 60 is removed.

Figure 3:
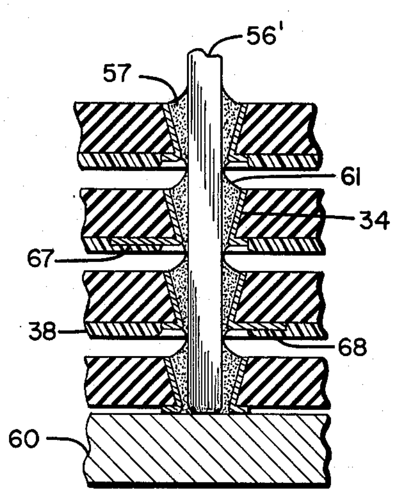
FIG. 3 is an enlarged cross-sectional side view of a portion of a stack of printed circuit cards, such portion including a single aligned series of apertures having an interconnecting means soldered to the lining on the individual aperture walls.

FIG. 3 illustrates a greatly enlarged view of a single interconnection accomplished in accord with the method of the present invention. The projection 56′ has been separated from its bridge portion at a point above the guide cards and the guide cards have been removed. A solder joint 57 has been formed between the projection 56′ and each aperture lining 34 in the particular aperture series. The projection 56′ is positioned as illustrated in FIG. 3 after each fillet has been melted. As a projection is urged into each aligned aperture series, the tip of the projection mechanically ruptures any oxide film that may have formed on the exposed surfaces of the solder fillet and thus any oxidation present does not interfere in the forming of a reliable solder electrical interconnection and accordingly there is no reason to use a flux. As the projection or interconnecting member moves through the liquid solder held within each aperture, a small amount of solder is displaced as at 61. The solder resist film prevents the displaced solder from flowing laterally between adjacent circuit cards and forming an electrically connecting bridge between the interconnecting member and adjacent circuitry or other interconnecting members. As is seen at 61, capillary action causes the solder to flow up the projections into the space between circuit cards. When the apertures formed in the support member are truncated, they are effective to properly locate the projections so that it passes through one aperture into the next with a relative degree of ease. Effectively each aperture acts as a funnel to channel the interconnecting member into the next adjacent aperture thereby guiding the member during its movement within the aligned aperture series. After all the projections have been inserted into the stacked members the proper distance, that is, until they abut the base member 60, the solder is permitted to harden and the solder joints 57 form. The interconnecting member, by way of the solder joints and aperture linings, electrically connects predetermined conductors on the stacked circuit cards in the manner illustrated in FIG. 3 where the conductors 67 and 68 are connected through their respective linings to solder joints connected to the interconnecting member.

Figure 4:
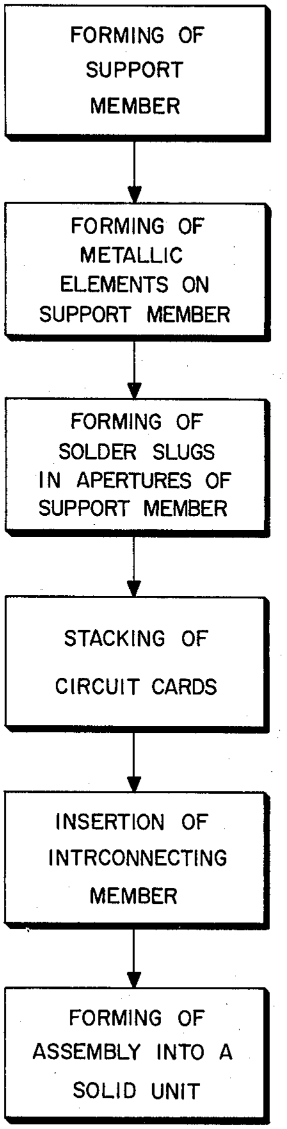
FIG. 4 is a flow chart illustrating a preferred process for electrically and mechanically interconnecting a plurality of superimposed printed circuit cards.

As is indicated by the flow chart of FIG. 4, the method disclosed herein commences with the preparation of the insulating support member. In the preferred method of practicing the present invention, the support member is formed from a high temperature epoxy resin by molding. The molding process may be accomplished in accord with well known and conventional techniques. The desired configuration of apertures is formed during the molding operation and the mold is appropriately constructed to provide the desired tapered apertures. Since a tapered aperture is most easily and economically fabricated by molding, the molding process represents the most desirable technique for forming the support member. As was pointed out before, other types of materials may also be used to form the support member, and when materials that do not lend themselves to molding are used, more conventional methods may be used to form the support member. The desired aperture pattern may of course, be formed by etching, drilling, or punching.

Next step 2 is performed. Subsequent to the forming of the support member, the surface area thereof, including the aperture walls, is coated with a layer of electrically conductive material, such as copper. The coating process may be readily performed in accordance with well known electroplating techniques for plating on an electrically non-conductive material. For example, after proper cleaning, a thin layer of copper may be caused to chemically deposit on the surface of the support member, this chemically deposited copper layer being subsequently increased in thickness by electrodepositing additional copper thereon. In the instant embodiment, a thin layer of gold is selectively electrodeposited over portions of the copper coating, such gold later serving as a resist during the copper etching operation. Well known resists, commercially available in the metal finishing industry, may be used to limit deposition of gold to predetermined areas. These areas include the conductors, annular rings, aperture walls, and the entire planar surface on the non-circuit bearing side of the card. After the gold has been deposited, the plating resist is removed and the unprotected copper etched away with an etchant such as a suitable solution of ferric chloride. After the etching operation has been completed, the metal deposited on the non-circuit bearing surface of the card is removed by abrading. Of course, this area could have been etched away if no gold were deposited thereon, but in order to avoid etchant undercutting of the copper lining on the aperture walls, it is deemed expedient to initially protect this area from the etchant and remove the undesirable metallic deposit by abrading.

Step 3 is initiated after the etched cards are properly cleaned and includes the preferential coating of the cards with a solder resist. Preferably photo sensitive solder resists are used, one such commercially available resist being mentioned hereinbefore. The card is coated with the resist by dipping, and after drying, the resist is selectively exposed to a light source through a suitable negative. The negative exhibits a particular dot pattern which corresponds with the circuit card aperture pattern such that when the negative is properly registered with the card, the resist coating on the aperture linings is not exposed to light. After exposure, the resist is developed and the unexposed resist on the aperture linings and non-circuit bearing surface of the card is removed by the appropriate solvent. Preferably the dot pattern is large enough to prevent the exposure of any resist material disposed on the annular rings surrounding each aperture. However, this is not critical and can be accommodated. After the solder resist coating of the card has been completed, the aperture linings are treated with a suitable solder flux which may be a conventional rosin type flux. The fluxing of the aperture linings is best accomplished by immersing the card in a flux solution. After fluxing, the card is placed in an oven where it is uniformly heated to a temperature adequate to dry the flux which temperature may fall in the range of about 450° F. to 500° F. After the card has been heated and while it is still at the desired temperature, it is immersed in a solder bath which preferably consists of a solder alloy composed of approximately 60% tin with the remainder lead. This particular solder alloy was selected because it permits soldering at a minimum temperature. However, when the support member is constructed of a material which can tolerate higher temperatures, other solder alloys melting at higher temperatures may be used. The pre-heating of the circuit member to a temperature compatible with that of the solder alloy is recommended for avoiding thermal shock, however, this step can be avoided. After a three to five second immersion in the solder bath during which time the card or the liquid solder is moved appropriately to cause solder to flow through the apertures, the card is removed and permitted to cool at room temperature. Relative motion of the liquid solder and the card is desired to avoid the formation of major voids in the solder fillets. The solder resist is effective to prevent the card from being solder coated except within the aperture portion and, because the apertures are relatively small, the linings are not merely solder coated, but rather the entire aperture is substantially filled with solder. When the card is initially removed from the bath, the solder, of course, is in its liquid state. However, the liquid solder is held within the apertures by surface tension until it cools and hardens. After the solder fillets are formed in the apertures, the solder resist material may be removed. However, it is preferred that the resist be permitted to remain to protect the conductors during handling and to serve as an insulation coating.

Step 4 is initiated by assembling the cards into stacks. The circuit cards are sandwiched between the cover card and the guide cards, all of these cards being arranged such that the apertures of any one card are registered with the apertures of any other card. Further, the cards are disposed such that the smaller diametered end of the apertures of one card open into the larger diametered end of the apertures of the next adjacent card. A fixture, provided with guide pins which assists in registering the cards, is used to facilitate the stacking of the cards. The spacer members between the circuit cards are properly located by certain ones of the guide pins which are laterally spaced a sufficient distance to accommodate the spacers and arranged to cause the spacer to be located with respect to the cards in an area where they will not interfere with the circuit card apertures. Spacers are not necessary between the guide cards nor between the guide card and the next adjacent circuit card. After, the cover card, the desired number of circuit cards and the guide cards have been properly arranged, the fixture cover member is placed adjacent the uppermost guide card and secured in position by a clamping means. The cover member is designed to engage the uppermost guide board at the perimeter thereof such that compression forces may be exerted on the card assembly by the clamping means. Sufficient pressure is placed on the card assembly to maintain the members thereof in fixed relation. Thereafter the riser members are located such that the individual projections thereon have portions thereof disposed in the appropriate apertures of the guide cards.

After the riser members have been arranged relative to the stack of cards, step 5 is initiated. The completed assembly, which includes the fixture, the guide, cover and circuit cards, and the riser members, is then immersed in an oil bath which is preferably at a temperature in the range of 120° F. to 150° F. After the assembly is immersed, the oil bath is gradually heated to about 410° F., the bath temperature going from 120° to 410° F. in approximately one hour.

After the solder alloy present in the assembly has melted and preferably a few minutes after the bath temperature reaches about 410° F. a slight force is placed on the riser members to urge the projections into the particular aperture series with which each is vertically aligned. After all the projections have been properly located within the assembly, the oil bath is permitted to cool. When the bath temperature reaches about 200°

F., the assembly is removed from the bath and washed in a solution of trichloroethylene. The cleaning after soldering is rather thorough and also includes vapor degreasing in trichloroethylene and another wash in a solution of trichlorotrifluoroethane freon (a liquid at room temperature). The fixture may be removed before or after the cleaning operation. After cleaning, the bridge portion of each riser member is removed, the projections being severed from the bridge portion at a point just above the uppermost guide card. The guide cards are then removed and the stack is electrically tested. If electrical testing reveals circuit deficiencies, the stack may be again disposed within the fixture and immersed in a heated oil bath. When the solder has been liquified, the individual interconnecting member may be removed. As the members are withdrawn, gravitational forces apparently cause the liquid solder which has been displaced from the apertures to flow back into the apertures. Therefore, after the interconnecting members have been withdrawn from the stack, and the stack permitted to cool so that the solder fillets may harden, the stack may be disassembled and the defective circuit members replaced. The stack would then be reassembled in the manner disclosed herein.

After electrical testing, it may be desirable to pot the circuit stack for forming a solid assembly in which case step 6 is initiated. The stack is placed in an appropriate container in a vacuum oven, and potted with an epoxy resin which fills the spaces between adjacent cards. Potting may be accomplished in the usual and conventional manner. After potting, the edges of the stack are ground down to remove any excess potting compound. Thereafter a female connector is affixed, for example, by soldering or crimping, to each outwardly extending end portion of the projections. Electrical connections between the circuit cards and external apparatus (not shown) may then be made by way of the female connectors.

It is understood that suitable modifications may be made in the structure as disclosed provided such modifications come within the spirit and scope of the appended claims.

Having now, therefore, fully illustrated and decribed my invention, what I claim to be new and desire to protect by Letters Patent is:

1. The soldering method for joining a plurality of apertured printed circuit members, which method includes the steps of:

(a) forming a lining of electrically conductive material on at least a portion of selected aperture walls and disposing a piece of a material substantially within each of the lined apertures, which material is composed, at least in part, of a solder alloy;

(b) stacking the printed circuit members such that the lined aperatures of one circuit member are aligned with the lined apertures in the next adjacent circuit member so as to form a plurality of series of aligned lined apertures;

(c) arranging an interconnecting member adjacent at least one series of aligned lined apertures;

(d) immersing the stacked printed circuit members and the arranged interconnecting member into an oil bath heated to a temperature at least as great as the melting point temperature of the solder alloy;

(e) and urging the interconnecting member into a series of aligned lined apertures after the solder alloy portion of the piece of material disposed within each lined aperture has melted.

2. A soldering method for joining a plurality of printed circuit members of the type having at least one electrical conductor on at least one side thereof and having a plurality of apertures formed therethrough, selected ones of the apertures having secured therein an electrically conductive material, which method includes the steps of:

(a) disposing a slug of a solder alloy within each aperture wherein there is disposed an electrically conductive material;

(b) arranging the printed circuit members such that the selected ones of the apertures of one circuit member are aligned with the selected ones of the apertures in the next adjacent circuit member so as to form a plurality of series of aligned apertures;

(c) arranging an interconnecting member adjacent each series of aligned apertures;

(d) immersing the arranged printed circuit members and interconnecting members into an oil bath heated to a temperature above the melting point temperature of the solder alloy;

(e) urging an interconnecting member into each series of aligned apertures after the solder slugs within each aperture have melted;

(f) and thereafter permitting the melted solder to harden for allowing the formation of a solder joint between the conductive material secured within each aperture of an aligned series of apertures and the interconnecting member disposed within the aperture series.

3. A soldering method for joining a plurality of apertured printed circuit members, which method includes the steps of:

(a) forming a lining of electrically conductive material within at least one of the apertures of each circuit members, the lining being disposed on the aperture wall;

(b) disposing a solder alloy slug within the lined apertures;

(c) stacking the printed circuit members such that the lined apertures of one circuit member are aligned with the lined apertures in the next adjacent circuit member so as to form at least one series of aligned apertures;

(d) arranging an elongated interconnecting member adjacent at least the one series of aligned apertures;

(e) immersing the superimposed printed circuit members and arranged interconnecting member into an oil bath;

(f) heating the oil bath to a temperature not less than the melting point temperature of the solder alloy;

(g) urging an interconnecting member into at least the one series of aligned apertures after the solder fillets disposed within each aperture have melted;

(h) and thereafter permitting the oil bath to cool to a temperature below the melting point of solder for allowing the formation of a solder joint between each aperture lining of an aligned series of apertures and the interconnecting member disposed through the apertures series.

4. A method as in claim 1 and further including the step of disposing an alignment means adjacent the stacked printed circuit members for maintaining each of the arranged interconnecting members in substantial vertical alignment with its associated series of aligned apertures.

5. A soldering method for electrically joining a plurality of printed circuit members, which methods includes the steps of:

(a) forming a plurality of tapered apertures in each circuit member, the apertures being arranged in accord with a predetermined pattern;

(b) disposing a solderable material within the apertures on the walls thereof;

(c) disposing a slug of a solder alloy in contact with the solderable material;

(d) superimposing the circuit members such that the apertures of one circuit member are aligned with the apertures in the next adjacent circuit member so as to form a plurality of series of aligned apertures;

(e) arranging an elongated interconnecting member adjacent each series of aligned apertures in substantial vertical alignment therewith;

(f) immersing the superimposed circuit members and arranged interconnecting members into an oil bath;
(g) heating the oil bath to a temperature above the melting point temperature of the solder alloy;
(h) urging each interconnecting member into a series of aligned apertures after the solder slugs have melted;
(i) and thereafter permitting the solder to cool to a temperature below its melting point for allowing the formation of a solder joint between the solderable material within each aperture of an aligned series of apertures and the interconnecting member disposed through the aperture series.

6. A soldering method for joining a plurality of printed circuit members, which method includes the steps of:
(a) forming a plurality of apertures in each circuit member, the apertures having different diameters at their opposite ends and being arranged on each member in accord with a predetermined pattern;
(b) disposing a solderable material within the apertures on the walls thereof;
(c) disposing a fillet of a solder alloy within the apertures, which fillet is secured to the solderable material;
(d) superimposing the circuit members such that the apertures of one panel are aligned with the corresponding apertures in the next adjacent circuit member so as to form a plurality of series of aligned apertures and such that the smaller diametered ends of the apertures of one circuit member open into the larger diametered ends of the apertures of the next adjacent circuit member;
(e) arranging an elongated interconnecting member adjacent each series of aligned apertures;
(f) immersing the superimposed circuit members and arranged interconnecting members into an oil bath;
(g) heating the oil bath to a temperature above the melting point temperature of the solder;
(h) urging each interconnecting member into a series of aligned apertures after the solder fillets disposed within each aperture have melted;
(i) and thereafter permitting the solder to cool to a temperature below its melting point for allowing the formation of a solder joint between each aperture lining of an aligned series of apertures and the interconnecting member disposed through the aperture series.

7. A soldering method for joining a plurality of apertured printed circuit members, which method includes the steps of:
(a) forming a lining of electrically conductive solderable material within the apertures on the walls thereof;
(b) disposing a fillet of a solder alloy within each lined aperture;
(c) stacking the circuit members in superimposed, spaced-apart relation such that the apertures of one circuit member are aligned with the apertures in the next adjacent circuit member so as to form a plurality of series of aligned apertures;
(d) arranging an elongated solder-coated interconnecting member adjacent each series of aligned apertures in substantial vertical alignment therewith;
(e) immersing the superimposed printed circuit members and arranged solder-coated members into an oil bath;
(f) heating the oil bath to a temperature above the melting point temperature of the solder;
(g) urging each interconnecting member into a series of aligned apertures after the solder fillets disposed within each aperture have melted;
(h) permitting the oil bath to cool to a temperature below the melting point of solder for allowing the formation of a solder joint between each aperture lining of an aligned series of apertures and the interconnecting member disposed through the aperture series;
(i) and thereafter filling the space between adjacent printed circuit members with an insulating material.

8. A soldering method for joining a plurality of apertured printed circuit members, having at least one conductor on at least one major surface, thereof, which includes the steps of:
(a) forming a lining of electrically conductive material within selected ones of the apertures on the walls thereof;
(b) coating at least the conductors on the printed circuit member with a solder resist film;
(c) locating liquid solder within each lined aperture, which solder is thereafter permitted to harden within the aperture;
(d) superimposing the printed circuit members in spaced apart relation and such that the lined apertures of one member are aligned with the lined apertures in the next adjacent member so as to form a series of aligned lined apertures;
(e) arranging an elongated interconnecting member adjacent each series of aligned lined apertures;
(f) immersing the superimposed printed circuit members and arranged interconnecting members into an oil bath, which oil bath is at a temperature beneath the melting point temperature of the solder;
(g) gradually heating the oil bath to a temperature above the melting point temperature of the solder;
(h) urging each interconnecting member into a series of aligned apertures after the solder fillets disposed within each aperture have melted;
(i) and thereafter permitting the oil bath to cool to a temperature below the melting point of solder for allowing the formation of a solder joint between each aperture lining of an aligned series of apertures and the interconnecting member disposed through the aperture series.

9. A soldering method for joining a plurality of printed circuit members, which method includes the steps of:
(a) forming a plurality of apertures in each circuit member, the apertures being arranged in accordance with a predetermined pattern;
(b) forming a lining of electrically conductive solderable material within the apertures on the walls thereof;
(c) immersing the apertured circuit members in a liquid solder bath for permitting the solder to flow into each lined aperture, an amount of liquid solder being retained in the apertures by surface tension when the circuit members are initially removed from the solder bath;
(d) permitting the liquid solder within each lined aperture to harden for forming a solder slug which is contained substantially within the aperture and adheres to the conductive material forming the aperture lining;
(e) stacking the circuit members such that the solder slug containing apertures of one circuit member are aligned with the corresponding solder slug containing apertures of the next adjacent circuit member so as to form a plurality of series of aligned solder containing apertures;
(f) disposing an alignment means, having a plurality of truncated apertures formed therethrough and arranged therein in accordance with the predetermined pattern, adjacent to and in alignment with the stacked circuit members such that each aligned aperture series includes a truncated aperture;
(g) arranging an interconnecting member with respect to each aligned aperture series, a portion of the interconnecting member being disposed in the truncated aperture of the series for maintaining the interconnecting member in alignment with its aperture series;

(h) immersing the circuit members, interconnecting members and alignment means into an oil bath, which oil bath is at a temperature beneath the melting point of the solder;
(i) heating the oil bath to a temperature at least as great as the melting point temperature of the solder;
(j) urging an interconnecting member into each series of aligned apertures after the solder has melted;
(k) and thereafter permitting the solder to harden for forming a solder joint between each aperture lining of the apertures in an aligned aperture series and the interconnecting member disposed within the aperture series.

10. A method as in claim 9 and further including the step of disposing a protection means, having a plurality of apertures formed therethrough and arranged therein in accordance with the predetermined pattern, adjacent to and in alignment with the stacked circuit members, the circuit members being located between the alignment means and the protection means.

11. A method as in claim 10 and further including the steps of forming a lining of solderable material within the apertures of the protection means and forming a solder slug within the lined apertures of the protection means.

12. A soldering method for joining a plurality of printed circuit members in superimposed relationship, which method includes the steps of:
(a) Forming a plurality of apertures in each circuit member, the apertures being provided with a tapered geometry and exhibiting different diameters at their opposite ends and being arranged on each circuit member in accord with the predetermined pattern;
(b) forming a lining of electrically conductive material within selected ones of the apertures on the walls thereof;
(c) coating at least the conductors on the printed circuit member with a solder resist film;
(d) locating liquid solder within each lined aperture, which solder is thereafter permitted to harden within the aperture;
(e) superimposing the circuit members such that the lined apertures of one panel are aligned with the corresponding lined apertures in the next adjacent circuit member so as to form a plurality of series of aligned lined apertures and such that the smaller diametered ends of the apertures of one circuit member open into the larger diametered ends of the apertures of the next adjacent circuit member;
(f) arranging an elongated interconnecting member adjacent each series of aligned lined apertures;
(g) immersing the superimposed printed circuit members and arranged interconnecting members into an oil bath, which oil bath is at a temperature beneath the melting point temperature of the solder;
(h) gradually heating the oil bath to a temperature above the melting point temperature of the solder;
(i) urging each interconnecting member into a series of aligned apertures after the solder fillets disposed within each aperture have melted;
(j) and thereafter permitting the oil bath to cool to a temperature below the melting point of solder for allowing the formation of a solder joint between each aperture lining of an aligned series of apertures and the interconnecting member disposed through the aperture series.

References Cited by the Examiner

UNITED STATES PATENTS

| | | | |
|---|---|---|---|
| 699,592 | 5/02 | Thompson | 29—502 |
| 2,502,291 | 3/50 | Taylor | 29—155.5 |
| 2,907,925 | 10/59 | Parsons | 29—155.5 X |
| 2,932,772 | 4/60 | Bowman et al. | 29—155.5 X |

JOHN F. CAMPBELL, *Primary Examiner.*